United States Patent [19]

Oguri

[11] Patent Number: 5,300,833
[45] Date of Patent: Apr. 5, 1994

[54] LOW VOLTAGE BICMOS CIRCUIT HAVING ECL AND TTL INPUT BUFFERS AND NO INTERVENING LEVEL-SHIFT CIRCUITS

[75] Inventor: Takashi Oguri, Tokyo, Japan

[73] Assignee: Nec Corporation, Tokyo, Japan

[21] Appl. No.: 4,995

[22] Filed: Jan. 15, 1993

[30] Foreign Application Priority Data

Jan. 16, 1992 [JP] Japan ................................ 4-5270

[51] Int. Cl.$^5$ ........................................ H03K 19/092
[52] U.S. Cl. ............................... 307/475; 307/296.1; 307/443; 307/446
[58] Field of Search ............... 307/443, 446, 455–456, 307/475, 296.1

[56] References Cited

U.S. PATENT DOCUMENTS

| | | | |
|---|---|---|---|
| 4,879,480 | 11/1989 | Suzuki et al. | 307/446 |
| 4,939,393 | 7/1990 | Petty | 307/475 |
| 4,984,202 | 1/1991 | Kawahara et al. | 365/177 |
| 5,122,692 | 6/1992 | Seki | 307/443 X |
| 5,132,573 | 7/1992 | Tsuru et al. | 307/475 |

FOREIGN PATENT DOCUMENTS 03152798 6/1991 Japan .

*Primary Examiner*—David R. Hudspeth

[57] ABSTRACT

In the conventional configuration, when using circuits with different logical amplitude levels in mixture, the level converter circuit has been necessarily required, and this has been an element preventing the speeding up. Also when holding the ECL interface and the TTL interfaces in common, the level converter circuit is useless and the total size gets larger. In the present invention, for the semiconductor circuit mixed with the input buffer 1 receiving the signal amplitude voltage of the ECL interface, the input buffer 3 receiving the signal amplitude voltage of the TTL interface, and the MIS or BiMIS driver 2, the level converter circuit is not required by holding each signal amplitude voltage in Common, and it can be speeded up as much as the delayed time caused by the level converter circuit. And the total size of the switching between the TTL input buffer 3 and the ECL input buffer 1 can be reduced because there is no level converter circuit, and the ECL interface and the TTL interface can be easily mixed.

8 Claims, 4 Drawing Sheets

LOW VOLTAGE BICMOS CIRCUIT HAVING ECL AND TTL INPUT BUFFERS AND NO INTERVENING LEVEL-SHIFT CIRCUITS

BACKGROUND OF THE INVENTION

This invention relates to a semiconductor circuit, especially a technology on a circuit on which the ECL, MIS, and BiMIS circuits are in mixture.

Recently to effect a memory with both high speed and high integration, an ECL circuit with high speed controlling the logical amplitude and the semiconductors mixed with an MIS circuit and a BiMIS circuit with low electric power consumption although the logical amplitude extends to the power voltage, are much proposed. However the MIS or BiMIS circuit can not be directly driven by an output signal of the ECL circuit.

Accordingly a level converter circuit has been always required for the semiconductor circuit mixed with an ECL circuit and an MIS or BiMIS circuit.

FIG. 4(a) conventional configuration diagram of a semiconductor circuit mixed with an ECL circuit having an ECL interface, and an MIS or BiMIS circuit. FIG. 4(a) shows an embodiment in which the input buffer 11 is composed of an ECL circuit and the level converter circuit 12 and the driver 13 are composed of MIS or BiMIS circuits.

FIG. 4(b) is a circuit diagram showing an embodiment of the definite circuits of the input buffer 11, the level converter circuit 12, and the driver 13 in FIG. 4(a). In FIG. 4(b), the driver 13 is composed of a BiMIS circuit.

In both FIGS. 4(a) and 4(b), the power voltages of the points connected with the ECL circuit and the MIS or BiMIS circuit are all $V_{CC}$ (high electric potential) and $V_{EE}$ (low electric potential), and the power voltages applied to the ECL circuit and the MIS or BiMIS circuit are all same as $V_{CC}-V_{EE}$. Thus if making the power voltages applied to the ECL circuit and the MIS or BiMIS circuit consistent, the level converter circuit 12 is always required between the ECL circuit and the MIS or BiMIS circuit. Because the signal amplitude voltage of the ECL circuit comes lower than that of the MIS or BiMIS circuit.

Moreover, FIG. 5(a) shows a conventional configuration diagram of an MIS or BiMIS circuit having a TTL interface. FIG. 5(a) shows an example in which the input buffer 14 and the driver 13 are composed of an MIS or BiMIS circuit.

FIG. 5(b) is a circuit diagram showing an example of the definite circuit of the input buffer 14 and the driver 13 in FIG. 5(a). In FIG. 5(b), the input buffer 14 and the driver 13 are composed of BiMIS circuits.

In both FIGS. 5(a) and 5(b), the power voltages of the points connected with the MIS circuit or BiMIS circuit are all $V_{DD}$ (high electric potential) and $V_{SS}$ (low electric potential).

Accordingly a conventional construction mixed with an ECL circuit having an ECL interface, and an MIS or BiMIS circuit contains a level converter circuit.

Hereupon, to hold the TTL interface and the ECL interface in common, the level converter circuit becomes an element preventing speeding up and reducing the size.

SUMMARY OF THE INVENTION

The object of the present invention is to offer a high-speed semiconductor circuit comprising an ECL circuit and an MIS circuit or BiMIS circuit in mixture disusing a level convertor circuit by making each signal amplitude voltage in common. Another object of the present invention is to plan speeding-up and size reduction of the semiconductor circuit having an ECL interface and TTL interface in common.

The object of the present invention is achieved by a semiconductor circuit comprising an ECL input buffer receiving a signal amplitude voltage of an ECL interface and a TTL input buffer receiving a signal amplitude voltage of a TTL interface, and an MIS or BiMIS circuit selecting and receiving a signal amplitude voltage supplied from said ECL and TTL input buffers; wherein, a power voltage applied to said MIS or BiMIS circuit is set at a total voltage of an output signal amplitude voltage of said ECL input buffer and a threshold voltage of an MIS transistor comprising said MIS or BiMIS circuit, and set at a total voltage of an output signal amplitude voltage of the TTL input buffer and a threshold voltage of the MIS transistor comprising said MIS or BiMIS circuit.

More, the object of the present invention is achieved by a semiconductor circuit comprising an ECL input buffer receiving a signal amplitude voltage of an ECL interface and a TTL input buffer receiving a signal amplitude voltage of a TTL interface, and an MIS or BiMIS circuit selecting and receiving a signal amplitude voltage supplied from said ECL and TTL input buffers; wherein, a power voltage applied to said MIS or BiMIS circuit is set at a total voltage of an output signal amplitude voltage of said ECL input buffer and a threshold voltage of an MIS transistor comprising said MIS or BiMIS circuit, and set at a value less than a total voltage of an output signal amplitude voltage of the TTL input buffer and a threshold voltage of the MIS transistor comprising said MIS or BiMIS circuit.

More, the object of the present invention is achieved by a semiconductor comprising an ECL input buffer receiving a signal amplitude voltage of an ECL interface and a TTL input buffer receiving a signal amplitude voltage of a TTL interface, and an MIS or BiMIS circuit selecting and receiving a signal amplitude voltage supplied from said ECL and TTL input buffers; wherein, a power voltage applied to said MIS or BiMIS circuit is set at a value less than a total voltage of an output signal amplitude voltage of said ECL input buffer and a threshold voltage of an MIS transistor comprising said MIS or BiMIS circuit, and set at a total voltage of an output signal amplitude voltage of the TTL input buffer and a threshold voltage of the MIS transistor comprising said MIS or BiMIS circuit.

More, the object of the present invention is achieved by a semiconductor comprising an ECL input buffer receiving a signal amplitude voltage of an ECL interface and a TTL input buffer receiving a signal amplitude voltage of a TTL interface, and an MIS or BiMIS circuit selecting and receiving a signal amplitude voltage supplied from said ECL and TTL input buffers; wherein a power voltage applied to said MIS or BiMIS circuit is set at a value less than a total voltage of an output signal amplitude voltage of said ECL input buffer and a threshold voltage of an MIS transistor comprising said MIS or BiMIS circuit, and set at a value less than a total voltage of the output signal amplitude voltage of the TTL input buffer and a threshold voltage of the MIS transistor comprising said MIS or BiMIS circuit.

More, in the semiconductor circuit it is preferable that the power voltage applied to the MIS or BiMIS circuit is 0 to 0.6 V lower than the total voltage of the output signal amplitude voltage of the ECL input buffer and the threshold voltage of the MIS transistor comprising the MIS or BiMIS circuit.

Further more, in the semiconductor circuit it is preferable that the power voltage applied to the MIS or BiMIS circuit is 0 to 0.6 V lower than the total voltage of the output signal amplitude voltage of the TTL input buffer and the threshold voltage of the MIS transistor comprising the MIS or BiMIS circuit.

Thus, the semiconductor circuit by the present invention realizes disusing of a level convertor circuit and shortening the time in the memory in which the ECL input buffer having ECL interface and the MIS circuit or BiMIS circuit are in mixture as much as the delayed time caused by the level converter circuit. Also it is effective to reduce the space of the switching section of the ECL input buffer receiving a signal amplitude voltage of the ECL interface and the TTL input buffer receiving a signal amplitude voltage of the TTL interface as wide as space of a level convertor circuit.

DESCRIPTION OF THE EMBODIMENT OF THE INVENTION

Next, an embodiment of the present invention is described referring to the attached figures.

In this embodiment, the input buffer 1 receiving a signal amplitude voltage of the ECL interface is composed of an ECL circuit, and the driver 2 and the input buffer 3 receiving a signal amplitude voltage of the TTL interface are composed of MIS or BiMIS circuits.

The power voltages of the points connected with the ECL circuit are $V_{CC}$ and $V_{EE}$, while the power voltages of the points connected with the MIS or BiMIS circuit are $V_{DD}$ and $V_{SS}$ different from $V_{CC}$ and $V_{EE}$. Thus if differentiating the power voltages applied to the ECL circuit and the MIS or BiMIS circuit, no level converter is necessary to be provided circuit between the ECL circuit and the MIS or BiMIS circuit because the signal amplitude voltage of the ECL circuit and the MIS or BiMIS circuit can be set consistent.

Moreover, the size of the switch section between the input buffer 3 receiving the signal amplitude voltage of the TTL interface and the ECL input buffer 1 can be reduced because no level converter circuit is required, thus the ECL and TTL interfaces can be easily mixed.

Figure 1:
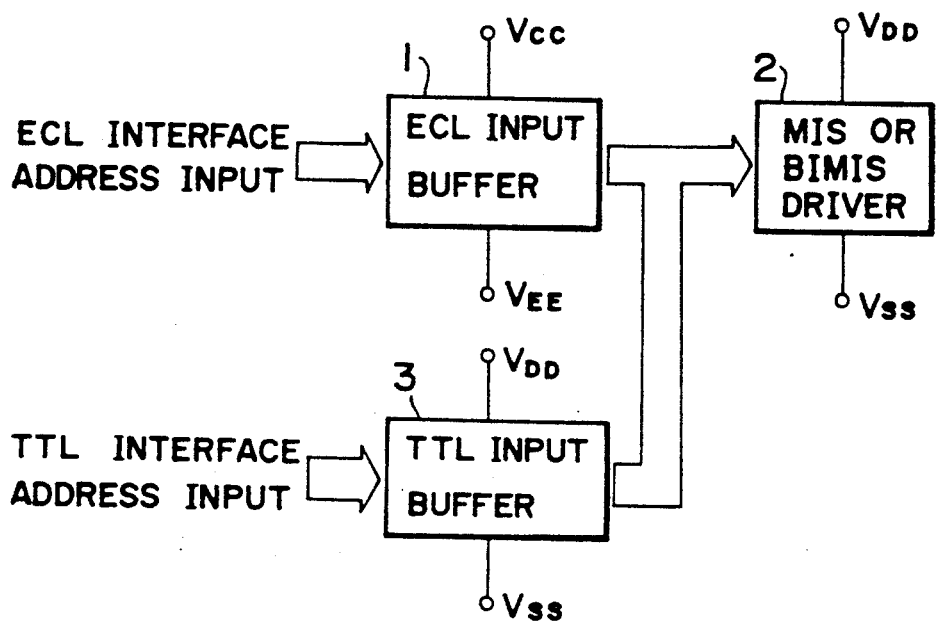
FIG. 1 is a configuration diagram showing an embodiment of the present invention.
Figure 2:
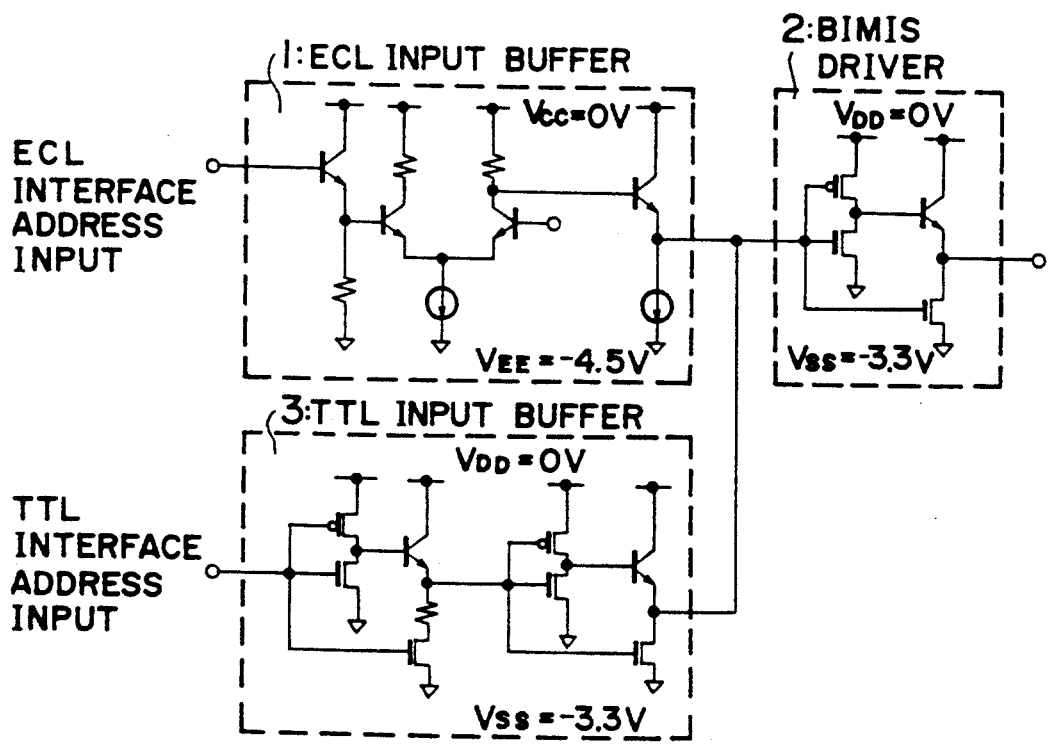
FIG. 2 is a definite circuit diagram showing the first embodiment of the present invention.

FIG. 2 is a diagram showing the first embodiment of the present invention, a definite circuit diagram of the ECL input buffer 1, the driver 2, and the TTL input buffer 3 in FIG. 1.

In FIG. 2 the power voltages of the points connected with the ECL input buffer 1 are $V_{CC}$ (0 V) and $V_{EE}$ (−4.5 V), while the power voltages of the points connected with the driver 2 of the BiMIS circuit are $V_{DD}$ (0 V) and $V_{SS}$ (−3.3 V).

Accordingly if differentiating the power voltages applied to the ECL input buffer 1 and the driver 2, no level converter circuit is necessary to be provided between the ECL input buffer 1 and the driver 2 because the output signal voltage (High Level= −0.8 V, Low Level= −2.5 V) of the ECL input buffer 1 and the input signal voltage (High Level= −0.8 V, Low Level= −2.5 V) of the driver 2 can be made consistent.

Hereupon, the threshold voltage of the PMISFET is −0.8 V, and that of the NMISFET is 0.8 V.

Figure 3:
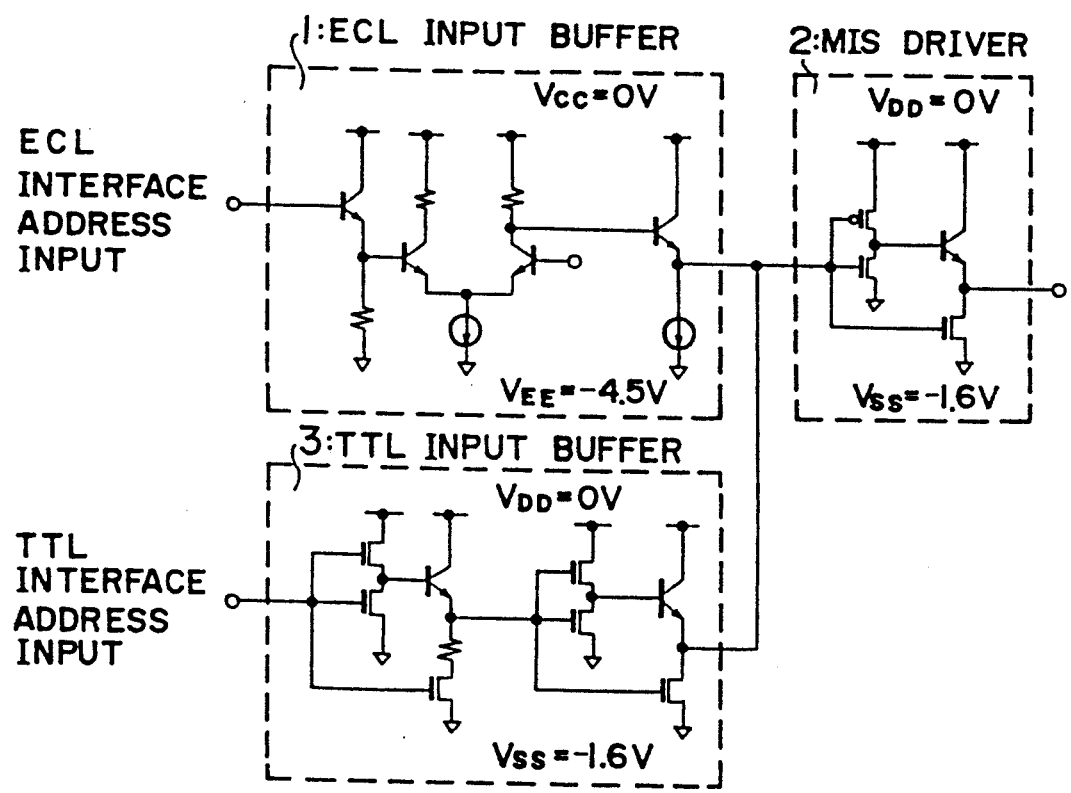
FIG. 3 is a definite circuit diagram showing the second embodiment of the present invention.
Figure 4A:
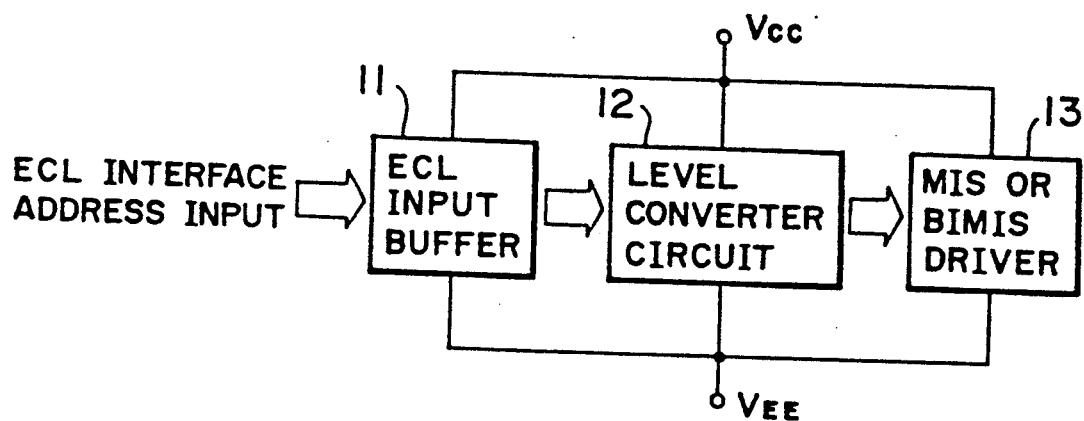
FIGS. 4a–4b are a circuit diagram showing a conventional configuration.
Figure 4B:
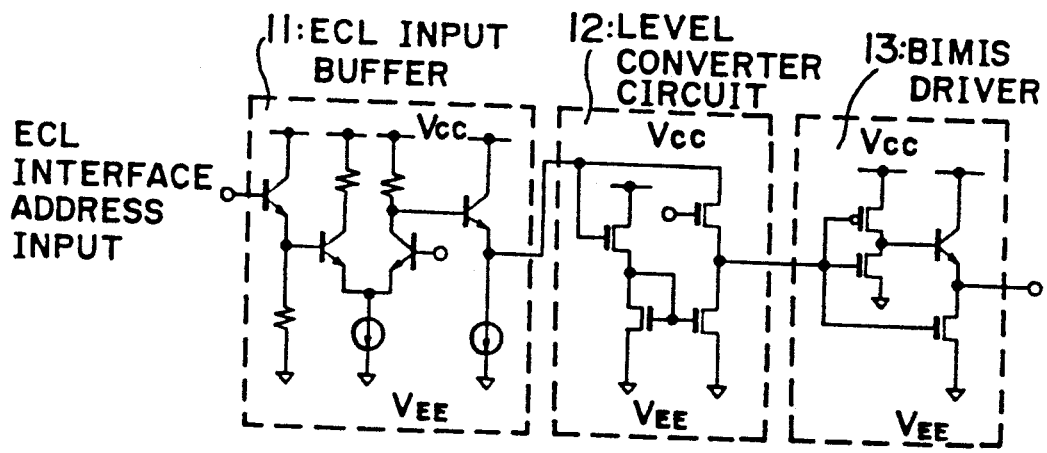
Figure 5A:
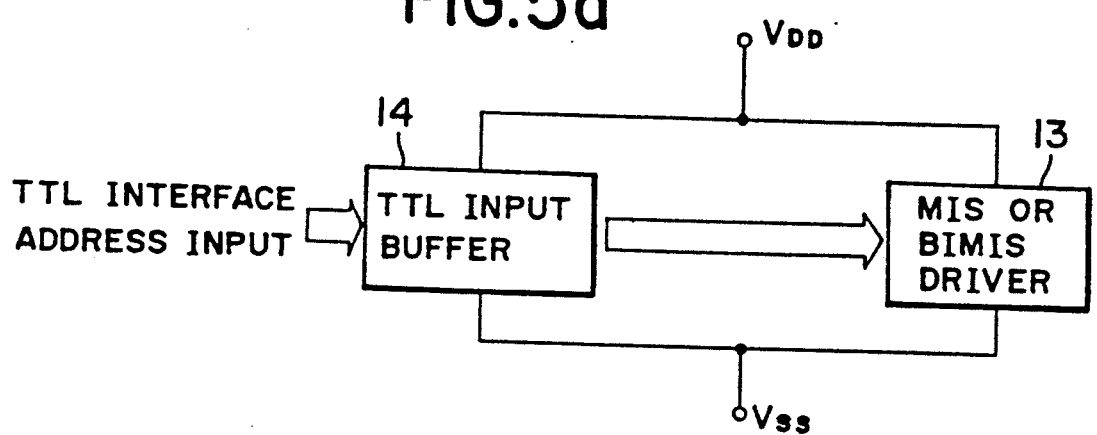
FIGS. 5a–5b are a circuit diagram showing the other conventional configuration.
Figure 5B:
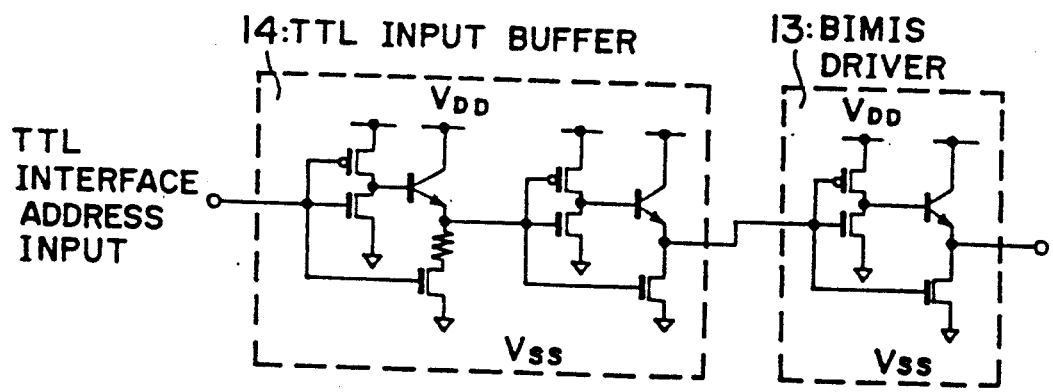

Next, FIG. 3 is a figure showing the second embodiment of this invention, and it also illustrates a circuit diagram showing an embodiment of the definite circuit of the ECL input buffer 1, the driver 2, and the TTL input buffer 3 in FIG. 1.

In FIG. 3 the power voltages of the points connected with the ECL input buffer are $V_{CC}$ (0 V) and $V_{EE}$ (−4.5 V), while the power voltages of the points connected with the driver 2 of the MIS circuit are $V_{DD}$ (0 V) and $V_{SS}$ (−1.6 V).

Accordingly if differentiating the power voltages applied to the ECL input buffer 1 and the driver 2, no level converter circuit is necessary to be provided between the ECL buffer 1 and the driver 2 because the output signal voltages of the ECL input buffer 1 and the input signal voltage of the driver 2 can be made consistent.

Hereupon, the threshold voltage of the PMISFET is is set at −0.8 V, that of the NMISFET is 0.8 V, and the output signal amplitude voltage of the ECL and TTL input buffers is 0.4 V with taking a noise margin into consideration, and the power voltage applied to the driver 2 is set at −1.6 V that is less than the total voltage of the output amplitude voltage and the threshold voltage.

Further more, as the switching between the ECL interfaces and the TTL interfaces in FIG. 1, 2 and 3, for example, "a switching by aluminum wiring" or "a switching by logical gate" can be adopted.

What is claimed is:

1. A semiconductor circuit comprising an ECL input buffer receiving a signal amplitude voltage of an ECL interface and a TTL input buffer receiving a signal amplitude voltage of a TTL interface, and an MIS or BiMIS circuit selecting and receiving a signal amplitude voltage supplied from said ECL and TTL input buffers; wherein, a power voltage applied to said MIS or BiMIS circuit is set at a total voltage of an output signal amplitude voltage of said ECL input buffer and a threshold voltage of an MIS transistor comprising said MIS or BiMIS circuit, and set at a total voltage of an output signal amplitude voltage of the TTL input buffer and a threshold voltage of the MIS transistor comprising said MIS or BiMIS circuit.

2. A semiconductor circuit comprising an ECL input buffer receiving a signal amplitude voltage of an ECL interface and a TTL input buffer receiving a signal amplitude voltage of a TTL interface, and an MIS or BiMIS circuit selecting and receiving a signal amplitude voltage supplied from said ECL and TTL input buffers; wherein, a power voltage applied to said MIS or BiMIS circuit is set at a total voltage of an output signal amplitude voltage of said ECL input buffer and a threshold voltage of an MIS transistor comprising said MIS or BiMIS circuit, and set at a value less than a total voltage of an output signal amplitude voltage of the TTL input buffer and a threshold voltage of the MIS transistor comprising said MIS or BiMIS circuit.

3. A semiconductor circuit as set forth in the claim 2, characterized in that the power voltage applied to the MIS or BiMIS circuit is 0 to 0.6 V lower than the total voltage of the output signal amplitude voltage of the TTL input buffer and the threshold voltage of the MIS transistor comprising the MIS or BiMIS circuit.

4. A semiconductor circuit comprising an ECL input buffer receiving a signal amplitude voltage of an ECL interface and a TTL input buffer receiving a signal amplitude voltage of a TTL interface, and an MIS or BiMIS circuit selecting and receiving a signal amplitude voltage supplied from said ECL and TTL input buffers; wherein, a power voltage applied to said MIS or BiMIS circuit is set at a value less than a total voltage of an output signal amplitude voltage of said ECL input buffer and a threshold voltage of an MIS transistor comprising said MIS or BiMIS circuit, and set at a total voltage of an output signal amplitude voltage of the TTL input buffer and a threshold voltage of the MIS transistor comprising said MIS or BiMIS circuit.

5. A semiconductor circuit as set forth in claim 4, characterized in that the power voltage applied to the MIS or BiMIS circuit is 0 to 0.6 V lower than the total voltage of the output signal amplitude voltage of the ECL input buffer and the threshold voltage of the MIS transistor comprising the MIS or BiMIS circuit.

6. A semiconductor circuit comprising an ECL input buffer receiving a signal amplitude voltage of an ECL interface and a TTL input buffer receiving a signal amplitude voltage of a TTL interface, and an MIS or BiMIS circuit selecting and receiving a signal amplitude voltage supplied from said ECL and TTL input buffers; wherein a power voltage applied to said MIS or BiMIS circuit is set at a value less than a total voltage of an output signal amplitude voltage of said ECL input buffer and a threshold voltage of an MIS transistor comprising said MIS or BiMIS circuit, and set at a value less than a total voltage of the output signal amplitude voltage of the TTL input buffer and a threshold voltage of the MIS transistor comprising said MIS or BiMIS circuit.

7. A semiconductor circuit as set forth in claim 6, characterized in that the power voltage applied to the MIS or BiMIS circuit is 0 to 0.6 V lower than the total voltage of the output signal amplitude voltage of the ECL input buffer and the threshold voltage of the MIS transistor comprising the MIS or BiMIS circuit.

8. A semiconductor circuit as set forth in claim 6, characterized in that the power voltage applied to the MIS or BiMIS circuit is 0 to 0.6 V lower than the total voltage of the output signal amplitude voltage of the TTL input buffer and the threshold voltage of the MIS transistor comprising the MIS or BiMIS circuit.

* * * * *